US006223571B1

(12) United States Patent
Rector

(10) Patent No.: US 6,223,571 B1
(45) Date of Patent: May 1, 2001

(54) MAGNETICALLY COUPLED KEYSTART SWITCH

(75) Inventor: Stephen W. Rector, Metamora, IL (US)

(73) Assignee: Caterpillar Inc., Peoria, IL (US)

( * ) Notice: Subject to any disclaimer, the term of this patent is extended or adjusted under 35 U.S.C. 154(b) by 0 days.

(21) Appl. No.: 09/276,945

(22) Filed: Mar. 26, 1999

(51) Int. Cl.[7] ................................................ E05B 47/00
(52) U.S. Cl. ................................................ 70/276; 70/252
(58) Field of Search .......................... 70/276–283, 252

(56) References Cited

U.S. PATENT DOCUMENTS

| 2,767,278 | 10/1956 | Collins . | |
|---|---|---|---|
| 3,944,762 | 3/1976 | Coleman et al. . | |
| 4,054,860 | 10/1977 | Henderson et al. . | |
| 4,285,220 | * 8/1981 | Kajita ........................................ | 70/276 |
| 4,392,134 | 7/1983 | Lutz . | |
| 4,737,785 | * 4/1988 | Zottnik ................................ | 70/276 X |
| 4,744,231 | * 5/1988 | Takagi et al. ........................ | 70/276 X |
| 5,202,580 | * 4/1993 | Janssen ................................ | 70/276 X |
| 5,551,267 | * 9/1996 | Janssen et al. ..................... | 70/276 X |
| 5,722,274 | * 3/1998 | Nakauchi et al. ..................... | 70/276 |
| 5,890,384 | * 4/1999 | Bartel et al. ........................ | 70/276 X |
| 5,892,443 | * 4/1999 | Friedrich ............................. | 70/276 X |
| 5,946,956 | * 9/1999 | Hotzl ..................................... | 70/276 |

FOREIGN PATENT DOCUMENTS

| 0 340 596 | 11/1989 | (EP) . | |
|---|---|---|---|
| 0 464 278 | 1/1992 | (EP) . | |
| 0 818 596 | 1/1998 | (EP) . | |
| 2187227 | * 9/1987 | (GB) ..................................... | 70/276 |
| 2198779 | * 6/1988 | (GB) ..................................... | 70/276 |
| 870651 | * 10/1981 | (SU) ..................................... | 70/276 |

* cited by examiner

*Primary Examiner*—Suzanne Dino Barrett
(74) *Attorney, Agent, or Firm*—Clifton G. Green

(57) ABSTRACT

An apparatus and method for magnetically activating an output signal from a keyswitch. The rotation of a keyswitch rotates a magnetic device into a first position. A magnetic sensing device detects the magnetic field created by the magnetic device, and transmits a flag signal.

36 Claims, 4 Drawing Sheets

Fig_2_
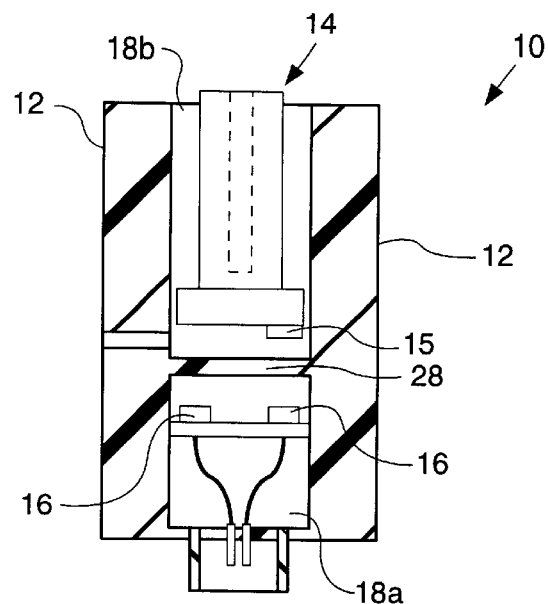
Fig_4b_
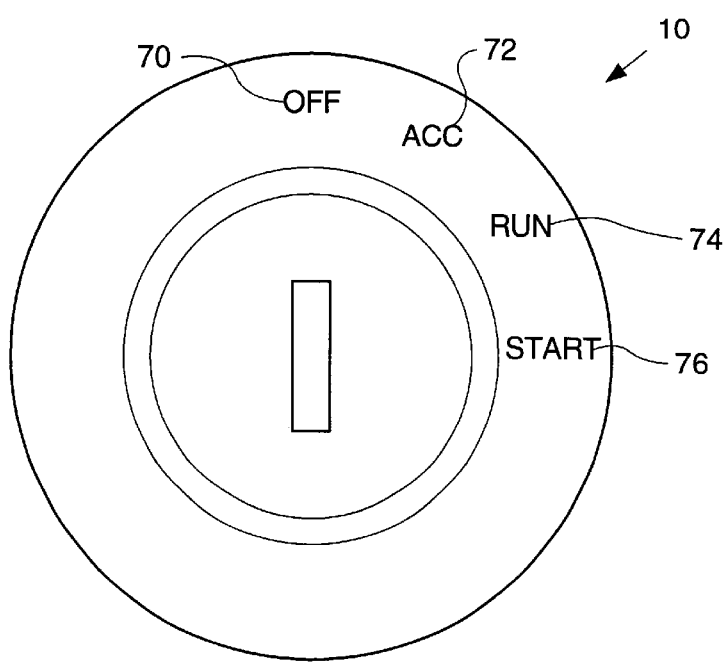

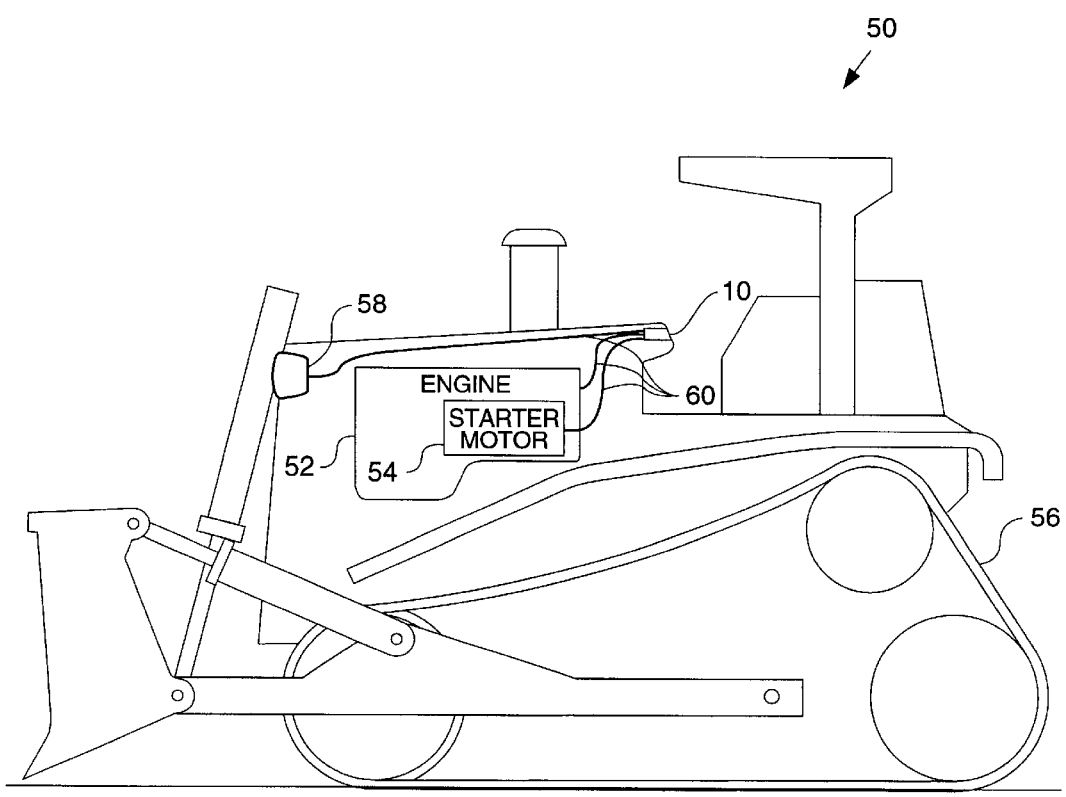
Fig_4a_

MAGNETICALLY COUPLED KEYSTART SWITCH

TECHNICAL FIELD

This invention relates generally to keystart switches, and more particularly to magnetically coupled keystart switches.

BACKGROUND ART

Keystart switches are used in operating machines of all types, such as automobiles, motorcycles, snowmobiles, trucks, and farm, construction and mining equipment. Many of these operating machines do not have an enclosed cab for protecting the operator and control panel from the environment. Instead, the operator and control panel are exposed to the environment. One component of the control panel that is particularly sensitive to environmental conditions is the keyswitch.

Conventional keyswitches typically have a lock cylinder and a housing. Upon insertion of an appropriate key, the lock cylinder is rotated, causing an electrical contact on the lock cylinder to make contact with an electrical contact on the housing. This closes a loop, forming a circuit that activates a function. Typical functions activated by a keyswitch in an operating machine are providing power to the accessories (such as lights, radio, power steering, etc.), or engaging the starter motor to crank the engine.

Environmental conditions, especially moisture, can cause abnormal operation of conventional keyswitches. Rain can penetrate the keyswitch and short-circuit the electrical contacts, causing the keyswitch to malfunction. A similar short-circuiting can also occur by other physical contaminants, such as some types of dust for example, entering the keyswitch.

One attempted solution to this problem is the use of seals around the exposed portions of the keyswitches. However, moisture and other contaminants can still enter the keyswitch via the keyhole. Further, the seals dry out and crack over time, allowing moisture and contaminants to enter through the cracks.

DISCLOSURE OF THE INVENTION

An apparatus and method for magnetically activating an output signal from a keyswitch. The keyswitch includes a housing, a magnetic sensing device, and a moveable body having a magnetic device that generates a magnetic field. The moveable body is disposed at least in part in the housing. The sensing device is disposed within the housing and physically isolated from the magnetic device. The sensing device detects a magnetic field of a predetermined magnitude and produces a flag signal as a function of detecting the magnetic field. The moveable body may receive a key having a first characteristic and rotate to cause the magnetic sensing device to detect the magnetic field from the magnetic device.

BRIEF DESCRIPTION OF THE DRAWINGS

FIG. 2 is a cross-sectional view of a keyswitch according to another embodiment of the invention.

FIG. 4A is one embodiment of an operating machine having the keyswitch of FIG. 1.

FIG. 4B is a front view of one embodiment of the keyswitch of FIG. 4A.

BEST MODE FOR CARRYING OUT THE INVENTION

Figure 1A:
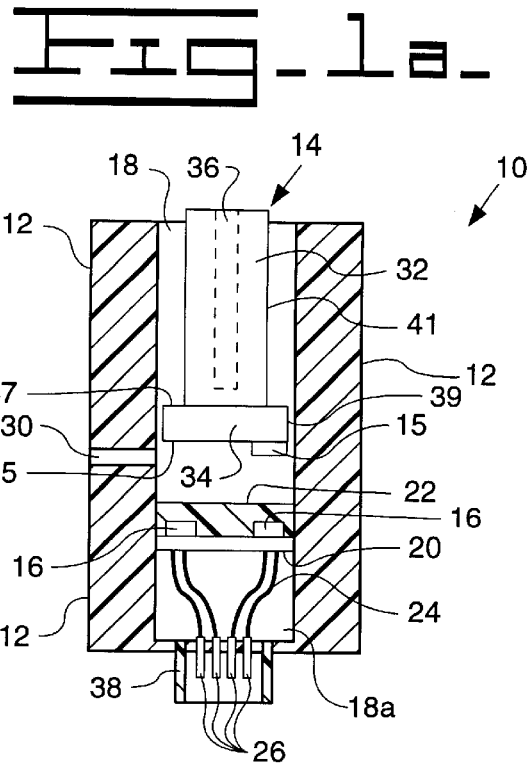
FIG. 1A is a cross-sectional view of a keyswitch according to one embodiment of the invention.

FIG. 1A is a cross-sectional view of a keyswitch 10 according to one embodiment of the invention. The keyswitch 10 includes a housing 12, a moveable body 14 having a magnetic device 15, and a magnetic sensing device 16.

Figure 1B:
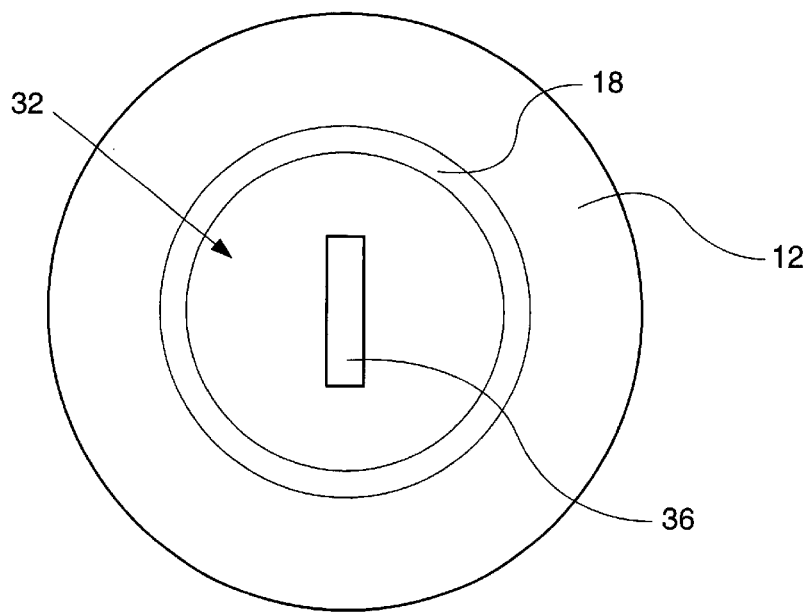
FIG. 1B is a top view of a keyswitch according to one embodiment of the invention.

FIG. 1B is a top view of the keyswitch 10. The housing 12 encircles the moveable body 14, and from the perspective of an operator, the keyswitch 10 is typically visually indistinguishable from conventional keyswitches.

Referring back to FIG. 1A, the housing 12 is comprised of a material that may be non-magnetic, such as plastic, ceramic, or an appropriate metal, or more typically, a magnetic material, such as an appropriate metal. The housing 12 includes an aperture 18 that contains at least a part of the moveable body 14. Although FIG. 1A shows a portion of the moveable body 14 protruding from the aperture 18, the entire moveable body 14 may also be contained within the aperture 18. Typically the housing 12 is a single, integral piece, but it may also be made of individual pieces fitted together. Further, while two sensing devices 16 are shown in FIG. 1A, a single sensing device 16 may be used instead.

The magnetic sensing device 16 is located within the aperture 18. The sensing device 16 may be mounted on a board, such as a circuit board 20, that is typically attached to the housing 12. The sensing device 16 may also be directly affixed to the housing 12, including being integrated into the housing 12, or may be mounted by any of a variety of appropriate ways known to those skilled in the art. The sensing device 16 detects magnetic fields created by the magnetic device 15, and generates a flag signal as a function of detecting a magnetic field of a predetermined magnitude. The strength of the magnetic field required to trigger the flag signal may be selected as appropriate.

Magnetic sensing devices are typically sensitive to the orientation of the magnetic field. Therefore, the sensing device 16 should be oriented in an appropriate direction to detect the expected magnetic field (as discussed below).

Because the strength of a magnetic field is a function of distance from the source of the field, if the characteristics of the magnetic device 15 are known, the distance of the magnetic device 15 from the sensing device 16 can be determined based on the strength of the magnetic field detected by the sensing device 16. Thus, by setting the strength of the magnetic field needed to be detected by the sensing device 16 in order to generate the flag signal, the distance the magnetic device 15 from the sensing device 16 when the flag signal is generated is also set.

In one embodiment, the sensing device 16 generates additional flag signals as a function of respectively detecting a magnetic field of other predetermined strengths. The other predetermined strengths are typically selected to correspond to additional desired positions of the keyswitch 10. Thus, a single sensing device 16 and a single magnetic device 15 can be used to generate multiple flag signals that correspond to respective positions of the magnetic device 15.

The sensing device 16 may use a hall effect sensor or hall effect switch to detect magnetic fields. When the hall effect device detects a magnetic field of a predetermined magnitude, the hall effect device produces the flag signal.

Alternately, the hall effect device may constantly output the flag signal, but vary the characteristics of the flag signal based on the strength of the detected magnetic field.

The flag signal is typically a relatively high voltage, such as $V_{cc}$, but may also be other voltage levels, such as ground. In another embodiment, the flag signal is a voltage having a magnitude that is proportional to the strength of the detected magnetic field. Additional relationships between the flag signal and the detected magnetic field may also be used. In one embodiment wherein the flag signal corresponds to the strength of the detected magnetic field (e.g., an analog voltage), the sensing device 16 constantly transmits the flag signal, but the flag signal only reaches a threshold state when the magnetic field having the predetermined magnitude is detected. Typically the threshold state triggers an event.

The keyswitch 10 may also contain circuitry (not shown) to process the output from the hall effect device into the appropriate flag signal. For example, if the hall effect device produces an analog voltage corresponding to the strength of the magnetic field, as mentioned above, but a discrete flag signal is desired, the circuitry may perform the conversion from one to the other.

In another embodiment, the magnetic sensing device 16 uses a magnetic reed switch to detect magnetic fields. When a magnetic field of a predetermined magnitude is applied to the reed switch, the switch closes, causing the flag signal to be transmitted.

In another embodiment, the magnetic sensing device 16 uses a magneto-resistor to detect magnetic fields. The resistance of the magneto-resistor changes corresponding to the strength of a magnetic field applied to the magneto-resistor. The flag signal may be generated when the resistance changes to a predetermined value, or may be generated constantly, with the characteristics of the flag signal varying as a function of the resistance.

A physical barrier, such as an encapsulant 22, physically isolates the sensing device 16 from the aperture 18 and the magnetic device 15. Thus, any moisture or dust particles entering the aperture 18 will not affect the sensing device 16, thereby preventing the flag signal from being generated inadvertently. Typical encapsulants 22 include various epoxies and Room Temperature Vulcanization (RTV) encapsulants known to those skilled in the art.

The encapsulant 22 may also be added to a lower portion 18a of the aperture 18, providing additional protection for the underside of the circuit board 20 and any components in the lower portion 18a of the aperture 18, such as wiring 24, circuitry (not shown) mounted on the underside of the circuit board 20, and pins 26.

FIG. 2 is a keyswitch according to another embodiment of the invention. A non-encapsulating barrier 28 physically isolates the sensing device 16 from the magnetic device 15. For example, a layer of plastic, resin, or other suitable material known to those skilled in the art may be interposed between the sensing device 16 and the magnetic device 15, or the non-encapsulating barrier 28 may be integrally molded into the housing 12 (as shown). Typically the non-encapsulating barrier 28 comprises a non-magnetic material to facilitate more accurate detection by the magnetic sensing device 16 of the magnetic fields. The keyswitch 10 functions similarly to what is described above, and will not be repeated.

Referring back to FIG. 1A, in one embodiment a drain hole 30 extends through the housing 12 and into the aperture 18. The drain hole 30 is typically positioned so that gravity will cause any condensation to exit the housing via the drain hole 30. The location of the drain hole 30 is thus dependent on the mounting orientation of the keyswitch 10. Although only a single drain hole 30 is shown in FIG. 1A, additional drain holes may also be used.

The moveable body 14 typically includes a lock cylinder 32 and carriage 34. The lock cylinder 32 has a key aperture 36 that is operable to receive a key (not shown). The magnetic device 15, such as a permanent magnet or electromagnet, is attached to or inserted within the moveable body 14. This may be done in a variety of ways. For example, the magnet may be directly adhered to the lock cylinder 32 via glue, cement, or epoxy. The magnet may also be press-fitted or otherwise adhered with/to the carriage 34, which may also be in turn press-fitted or otherwise adhered with/to the lock cylinder 32.

The magnetic device 15 need not be located on a lower face 35 of the carriage 34. For example, it may also be mounted on an upper face 37 of the carriage 34, or a respective outer edge 39, 41 of the carriage 34 or lock cylinder 32.

Although the carriage 34 is shown being circular and coupled to an end of the lock cylinder 32, the carriage 34 may have different configurations and be located elsewhere. For example, the carriage 34 may be a toroid (not shown) encircling a midportion of the lock cylinder 32.

In one embodiment, when a key having first characteristics, e.g., an etching pattern, matching the lock cylinder 32 is inserted into the key aperture 36, the key may be rotated, causing the lock cylinder 32 and carriage 34, including the attached magnetic device 15, to rotate. Details of the functioning of a lock cylinder 32 are well known to those skilled in the art and have been omitted for the purpose of brevity.

The position of the sensing device 16 is selected so the rotation of the magnetic device 15 into a first position, such as an "accessory" position, causes the sensing device 16 to detect a magnetic field of a first predetermined strength. When the sensing device 16 detects the magnetic field of the first strength, the sensing device 16 transmits a first flag signal. The first flag signal may be used, for example, to activate power to accessories of a device (not shown) using the keyswitch 10, such as the lights, radio, etc., of an operating machine (not shown).

When the key is rotated further, the magnetic device 15 rotates into a second position, such as a run position. The position of the sensing device 16 is selected so the rotation of the magnetic device 15 into the second position causes the sensing device 16 to detect a magnetic field of a second predetermined strength. When the sensing device 16 detects a magnetic field of the second strength, the sensing device 16 generates a second flag signal. The second flag signal may be used, for example, to activate power to the ignition system of the operating machine.

When the key is rotated further, the magnetic device 15 rotates into a third position, such as a start position. The position of the sensing device 16 is selected so the rotation of the magnetic device 15 into the third position causes the sensing device 16 to detect a magnetic field of a third predetermined strength. When the sensing device 16 detects a magnetic field of the third strength, the sensing device 16 generates a third flag signal. The third flag signal may be used, for example, to activate a starter motor (not shown) on an engine (not shown) of the operating machine.

Although three positions and three flag signals have been described above, either a fewer or greater number of positions and/or a fewer or greater number of flag signals may also be used.

The magnetic device 15 and sensing device 16 are positioned so that when the lock cylinder 32 is in a baseline position, e.g., the default non-rotated position when the key is not in the lock cylinder 32, the sensing device 16 does not detect a magnetic field of the of the first, second, or third predetermined magnitudes. Therefore, the sensing device 16 does not generate any of the flag signals. The baseline, first, second, and third positions are thus a function of the rotational path of the magnetic device 15, the strength of the magnetic device 15, and sensitivity of the sensing device 16 (i.e., the strength of magnetic field needed to trigger a flag signal from the sensing device 16).

As mentioned above, the sensing device 16 is sensitive to the orientation of the magnetic field. However, because the orientation of the magnetic device 15 is known (it is fixed within/on the carriage 34), and the position of the magnetic device 15 when the lock cylinder 32 and carriage 34 are rotated into each position is also known, the sensing device 16 may be placed and oriented appropriately to detect the magnetic field from the magnetic device 15.

As discussed above, the sensing device 16 generates a flag signal when the sensing device 16 detects a magnetic field having the appropriate strength. In one embodiment, the flag signal is transmitted from the sensing device 16 to pins 26 of a connector 38 via wiring 24. Some or all wiring 24 may also be integrated into the circuit board 20. In this situation, the connector 38 is typically directly coupled with the circuit board 20 or sensing device 16.

In another embodiment, more than one sensing device 16 may be used. The additional sensing devices 16 may detect a magnetic field when the lock cylinder 32 is in an additional position, or may work in conjunction with the first sensing device 16 for redundancy or improved accuracy in detecting the magnetic field when the lock cylinder 32 is in the first, second, or third position. For example, one sensing device 16 for each active position of the keyswitch 10, e.g., accessory, run, and start, may be used.

Figure 3:
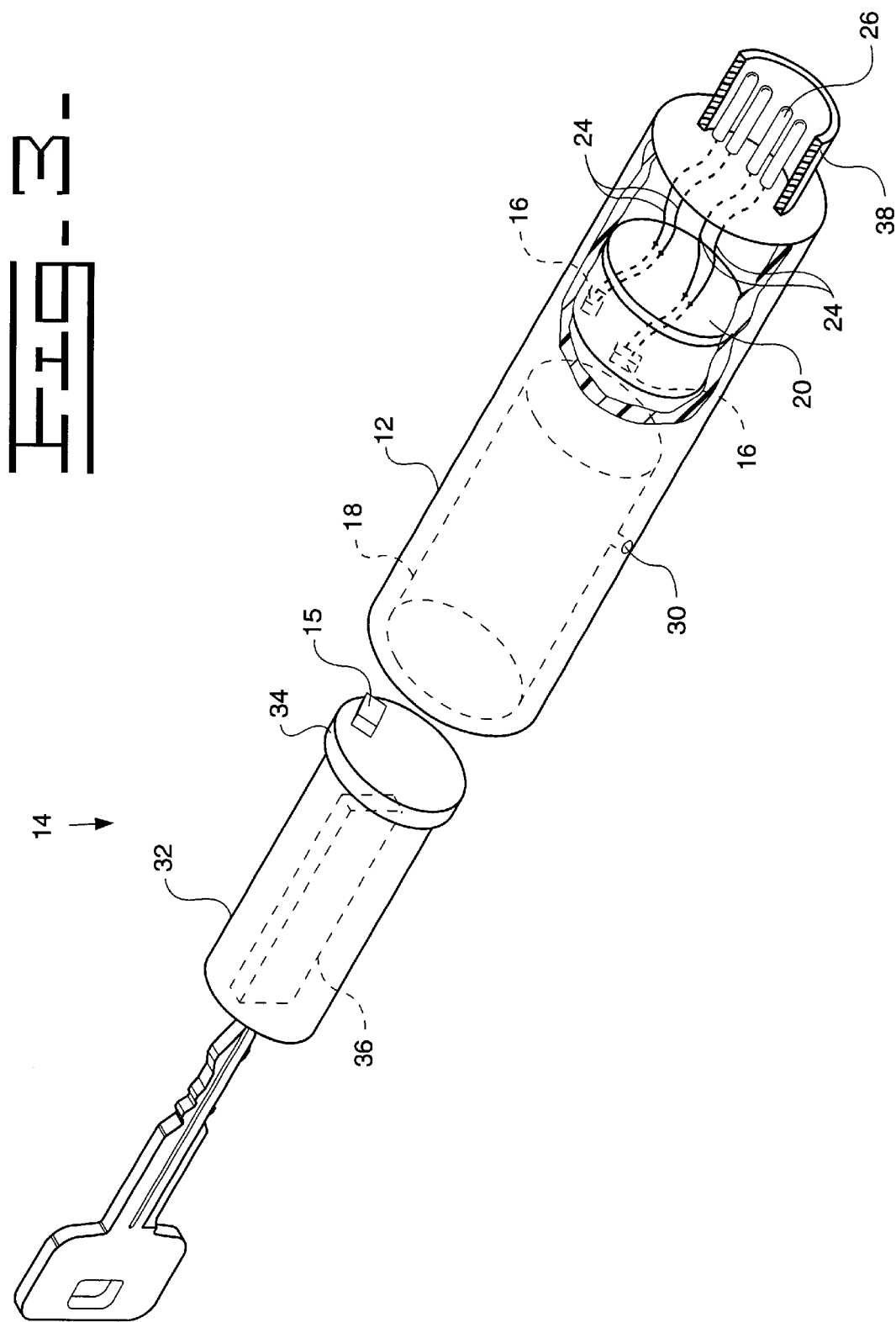
FIG. 3 is an exploded view of a keyswitch according to one embodiment of the invention.

FIG. 3 is an exploded view of a keyswitch 10 according to one embodiment of the invention. The keyswitch 10 functions similarly to what is described above, and will not be repeated in the interest of brevity.

FIG. 4A is one embodiment of an operating machine, such as a tractor 50, using the keyswitch 10 of FIG. 1. The tractor 50 includes an engine 52 having a starter motor 54, a ground engaging traction device such as a track 56, and various accessories, such as a light 58. The keyswitch 10 is coupled with the engine 52 and the light 58 by wires 60. The engine 52 is coupled with the track 56 by any of a variety of ways (not shown) known to those skilled in the art.

FIG. 4B is a front view of one embodiment of the keyswitch 10. In operation, with the use of an appropriate key (not shown), the keyswitch 10 may be turned from an OFF position 70 to an accessory position ("ACC") 72. In the ACC position 72, the keyswitch 10 sends a first flag signal that activates power delivery to the light 58 and other accessories (not shown). The light 58 is typically also controlled by a light switch (not shown) that must also be activated for the light 58 to turn ON.

The keyswitch 10 may be further turned from the ACC position 72 to a RUN position 74. In the RUN position 74, the keyswitch 10 sends a second flag signal that activates power delivery to an ignition system (not shown) of the engine 52. The ignition system typically also has other control inputs, such as an engine speed control (not shown) or an accelerator pedal (not shown).

The keyswitch 10 may be further turned from the RUN position 74 to a START position 76. In the START position 76, the keyswitch 10 sends a third flag signal that activates power delivery to the starter motor 54. The functioning of the engine 52 is known to those skilled in the art, and discussion of the generation of a propelling force by the engine 52, and transmission of the force to the propulsion system, such as a ground engaging traction device (e.g. a track 56, a tire), or propeller or turbine, is omitted in the interest of brevity.

Although the operation of the keyswitch 10 has been illustrated with a track-type tractor 50, the keyswitch 10 may also be used with a variety of other operating machines (not shown), such as snowmobiles, motorcycles, boats, personal watercraft, wheeled tractors, bulldozers, pavers, and other construction, farming, or mining equipment.

From the foregoing it will be appreciated that although specific embodiments of the invention have been described herein for the purposes of illustration, various modifications may be made without deviating from the spirit and scope of the invention. Accordingly, the invention is not limited except as by the appended claims.

What is claimed is:

1. A keyswitch, comprising:
   a non-magnetic housing;
   a magnetic sensing device disposed within the housing, the sensing device operable to detect a magnetic field of a predetermined strength, and to produce a flag signal as a function of detecting the magnetic field;
   a lock cylinder disposed at least in part within the housing and physically isolated from the magnetic sensing device, the lock cylinder having a first end operable to receive a key having a first characteristic and having a first portion operable to rotate to a first position; and
   a magnetic device coupled with the first portion of the lock cylinder at a second end of the lock cylinder, the second end being opposite the first end, the magnetic device operable to rotate with the first portion of the lock cylinder to cause the magnetic sensing device to detect a magnetic field from the magnetic device.

2. The keyswitch of claim 1 wherein the flag signal comprises a relatively high voltage.

3. The keyswitch of claim 1 wherein the flag signal comprises a voltage having a magnitude that is a function of the strength of the detected magnetic field.

4. The keyswitch of claim 3 wherein the voltage increases as the strength of the magnetic field increases and decreases as the strength of the magnetic field decreases.

5. The keyswitch of claim 1 wherein the magnetic device comprises a permanent magnet.

6. The keyswitch of claim 1 wherein the magnetic sensing device comprises a hall effect sensor.

7. The keyswitch of claim 1 wherein the magnetic sensing device comprises a hall effect switch.

8. The keyswitch of claim 1 wherein the magnetic sensing device comprises a magnetic reed switch.

9. The keyswitch of claim 1 wherein the magnetic sensing device comprises a magneto-resistor.

10. The keyswitch of claim 1, further comprising a carriage coupled with the lock cylinder and operable to rotate with the lock cylinder, the magnetic device being coupled with the lock cylinder via the carriage.

11. The keyswitch of claim 10 wherein the carriage is generally circular in shape.

12. The keyswitch of claim 10 wherein the magnetic device is press-fitted with the carriage.

13. The keyswitch of claim 10 wherein the magnetic device is coupled with the carriage by an adhesive.

14. The keyswitch of claim 10 wherein the carriage is press-fitted with the lock cylinder.

15. The keyswitch of claim 10 wherein the magnetic sensing device is encapsulated by an encapsulant, the encapsulant physically isolating the magnetic sensing device from the magnetic device.

16. The keyswitch of claim 15 wherein the encapsulant comprises at least one of an epoxy based encapsulant and an RTV based encapsulant.

17. The keyswitch of claim 1 wherein the magnetic sensing device is physically isolated from the lock cylinder by at least one of a potting agent, a resin, a plastic, and a non-magnetic metal.

18. The keyswitch of claim 1, further comprising a second magnetic sensing device disposed within the housing, the second sensing device operable to detect a magnetic field of a predetermined strength and to produce a second flag signal as a function of detecting the magnetic field, the first portion of the lock cylinder being further operable to rotate to a second position to cause the second magnetic sensing device to detect the magnetic field from the magnetic device.

19. The keyswitch of claim 1 wherein the sensing device is further operable to detect a magnetic field of a second predetermined strength and to produce a second flag signal as a function of detecting the magnetic field of the second predetermined strength, the lock cylinder being further operable to rotate to a second position to cause the magnetic sensing device to detect the magnetic field of the second predetermined strength.

20. The keyswitch of claim 1, further comprising a second magnetic device disposed within the housing, the second sensing device operable to detect the magnetic field from the magnetic device when the lock cylinder is in the second position and to produce a second flag signal as a function of detecting the magnetic field.

21. The keyswitch of claim 1 wherein the housing includes a first aperture having a wall, the lock cylinder being disposed at least in part within the first aperture, and the housing further includes an intersecting aperture extending through a side of the housing and the wall of the first aperture to an exterior of the housing.

22. The keyswitch of claim 1 further comprising a circuit board disposed within the housing, the magnetic sensing device being coupled with the circuit board.

23. The keyswitch of claim 1, further comprising a connector coupled with the housing, and coupled with the magnetic sensing device to receive the flag signal, the connector having an electrical contact to transmit the flag signal.

24. The keyswitch of claim 1 wherein the housing comprises:

an upper section; and a lower section coupled with the upper section.

25. The keyswitch of claim 24 wherein the lower section is press-fitted with the upper section.

26. An operating machine, comprising:

a keyswitch, comprising:

a non-magnetic housing;

a magnetic sensing device disposed within the housing, the sensing device operable to detect a magnetic field of a predetermined strength, and to produce a flag signal as a function of detecting the magnetic field;

a lock cylinder disposed at least in part within the housing and physically isolated from the magnetic sensing device, the lock cylinder having a first end operable to receive a key having a first characteristic and having a first portion operable to rotate to a first position; and a magnetic device coupled with the first portion of the lock cylinder at a second end of the lock cylinder, the second end being opposite the first end, the magnetic device operable to rotate with the first portion of the lock cylinder to cause the magnetic sensing device to detect a magnetic field from the magnetic device; and an engine coupled to the keyswitch to receive the flag signal, the engine operable to be activated as a function of receiving the flag signal, and operable to generate a propelling force as a function of being activated.

27. The operating machine of claim 26 wherein the flag signal comprises a relatively high voltage.

28. The operating machine of claim 26 wherein the magnetic sensing device comprises a hall effect sensor.

29. The operating machine of claim 26 wherein the magnetic sensing device comprises a hall effect switch.

30. The operating machine of claim 26 wherein the magnetic sensing device comprises a magnetic reed switch.

31. The operating machine of claim 26 wherein the magnetic sensing device comprises a magneto-resistor.

32. The operating machine of claim 26 wherein the magnetic sensing device is encapsulated by an encapsulant, the encapsulant physically isolating the magnetic sensing device from the magnetic device.

33. The operating machine of claim 26, further comprising a ground engaging traction device coupled with the engine to receive the propelling force, the ground engaging traction device operable to propel the operating machine as a function of receiving the propelling force.

34. A method for generating an activation signal using a keyswitch having a housing and a lock cylinder having a first end operable to receive a key, comprising:

displacing a magnetic field into a predetermined area adjacent to a second end of the lock cylinder in response to rotation of a key within the lock cylinder, the second end of the lock cylinder being opposite the first end; and sensing a magnetic field within the predetermined area of the keyswitch housing; and generating a flag signal in response to sensing the magnetic field within the predetermined area.

35. The method of claim 34 wherein displacing a magnetic field comprises moving a magnetic device.

36. The method of claim 34, further comprising:

sensing a magnetic field within a second predetermined area of the keyswitch housing; and generating a second flag signal in response to sensing the magnetic field within the second predetermined area.

* * * * *